US005467009A

United States Patent [19]

McGlinchey

[11] Patent Number: 5,467,009

[45] Date of Patent: Nov. 14, 1995

[54] VOLTAGE REGULATOR WITH MULTIPLE FIXED PLUS USER-SELECTED OUTPUTS

[75] Inventor: Gerard F. McGlinchey, Enniskerry, Ireland

[73] Assignee: Analog Devices, Inc., Norwood, Mass.

[21] Appl. No.: 243,454

[22] Filed: May 16, 1994

[51] Int. Cl.[6] .............................. G05F 1/40; H03K 5/22; H03K 5/153

[52] U.S. Cl. ............................ 323/269; 323/273; 327/50; 327/58

[58] Field of Search .................................... 323/266, 268, 323/269, 271, 272, 273; 307/231, 350, 351, 355, 360; 327/1, 50–52, 58–60, 62, 68, 72, 74, 90

[56] References Cited

U.S. PATENT DOCUMENTS

| | | | |
|---|---|---|---|
| 4,611,162 | 9/1986 | Erratico et al. | 323/269 |
| 4,797,569 | 1/1989 | Boyacigiller | 307/297 |
| 5,258,653 | 11/1993 | Perry | 323/269 |
| 5,280,233 | 1/1994 | Poletto et al. | 323/269 |
| 5,336,947 | 8/1994 | Lehning | 327/18 |
| 5,343,479 | 8/1994 | Kiyozuka | 327/58 |
| 5,391,950 | 2/1995 | Krawczak | 327/58 |
| 5,394,020 | 2/1995 | Neinaber | 327/58 |
| 5,408,172 | 4/1995 | Tanimoto et al. | 327/273 |

*Primary Examiner*—Matthew V. Nguyen
*Attorney, Agent, or Firm*—Koppel & Jacobs

[57] ABSTRACT

A voltage regulator is capable of providing multiple fixed outputs plus a user-selected output by the use of a window comparator circuit that produces one of three different possible outputs, depending upon whether an input control signal is above, below or within the window voltage range. Two of the outputs operate different switches within a feedback circuit for a multiplying operational amplifier, causing the amplifier to produce different regulated output levels depending upon which switch is operated. The third window output disables the operational amplifier and establishes a mode in which the regulated output is set by an external feedback circuit for another operational amplifier, with the external circuit connected across the circuit's input and output terminals.

16 Claims, 2 Drawing Sheets

VOLTAGE REGULATOR WITH MULTIPLE FIXED PLUS USER-SELECTED OUTPUTS

BACKGROUND OF THE INVENTION

1. Field of the Invention

This invention relates to voltage reference circuits, and more particularly to voltage references in which the user can select among a number of different output reference levels using only a single control pin.

2. Description of the Related Art

Voltage reference circuits are designed to produce a known fixed reference voltage at an output terminal. It is often desirable to allow the user to select among different fixed regulated voltage levels, or alternately to set his or her own regulated output at a level different from the levels designed into the circuit. A major obstacle to this type of capability is that only a very limited number of pins are typically available on an integrated circuit (IC) chip. While circuits could easily be designed with multiple input pins used to select among different output voltage levels, with each pin dedicated to a particular output, more than one input control pin may not be available for this purpose.

In U.S. Pat. No. 4,797,569 a single pin is used to select between a five volt reference output and a mode in which the user can establish the output level by connecting a user-selected external resistor circuit. An operational amplifier within the circuit includes a feedback circuit that establishes the 5 volt reference output. A switch is provided within the feedback circuit, and another switch is connected between a control terminal and the amplifier. When the user supplied voltage applied to the control terminal is less than a preset threshold level, as determined by a voltage comparator within the regulator circuit, the feedback switch is closed and the switch between the control terminal and the amplifier is opened; this allows the amplifier to establish the voltage at the output terminal at the predetermined 5 volt level. The switching pattern is reversed when the user applies a voltage above the threshold level to the control terminal. In this second mode a feedback circuit for the amplifier is completed by connecting a resistor circuit between the control and output terminals; the particular resistor values selected by the user determine the output reference voltage as the ratio of two external resistors.

While this patent represents an improvement in regulated voltage circuits, it is limited to a single internally generated output voltage level. It would be desirable to allow the user to select among multiple fixed internally generated voltages, without having to use more pins for this feature, while preserving a capability for the user to set his or her own output level.

SUMMARY OF THE INVENTION

The present invention seeks to provide a new voltage regulator that is capable of selecting between multiple fixed voltage outputs plus a user-selected output, with only a single pin required to make the selection. This is accomplished with a regulator circuit that includes a voltage window comparator with a voltage range defined by upper and lower window limits. An input terminal supplies an input selection voltage to the comparator, while an output circuit receives control inputs from both the input terminal and the comparator. The output circuit has first and second output states in which it supplies first and second respective fixed output voltages to an output terminal, and a third output state that enables the voltage at the output terminal to be externally set. The output circuit responds to input voltages in ranges above, below and within the window range by entering a different output state for each different input voltage range. Multiple fixed output voltages or a user-set voltage can thus be selected, depending upon the signal applied to the single input terminal.

In a preferred embodiment the upper window limit is below a high voltage supply level, the lower window limit is above a low voltage supply level, different fixed output voltages are produced when the input voltage is above or below the window range, and the user can select an adjustable output by applying an input voltage is within the window range. The output circuit consists of two operational amplifiers, one of which has a switchable feedback circuit that is switched to different amplifier gain levels depending upon whether the input voltage is above or below the window range. The other operational amplifier has one of its inputs connected to a reference voltage and its other input connected to the input terminal; when the input voltage is within the window range, the switching circuit is operated so that control over the output voltage is shifted to the second amplifier. In this mode an externally connected circuit completes a feedback circuit for the second amplifier that sets the regulator's output at a level determined by the external circuit. In all cases the output mode is selected by the voltage signal applied to the same input terminal.

These and other features and advantages of the invention will be apparent to those skilled in the art from the following detailed description, taken together with the accompanying drawings.

DETAILED DESCRIPTION OF THE INVENTION

Figure 1:
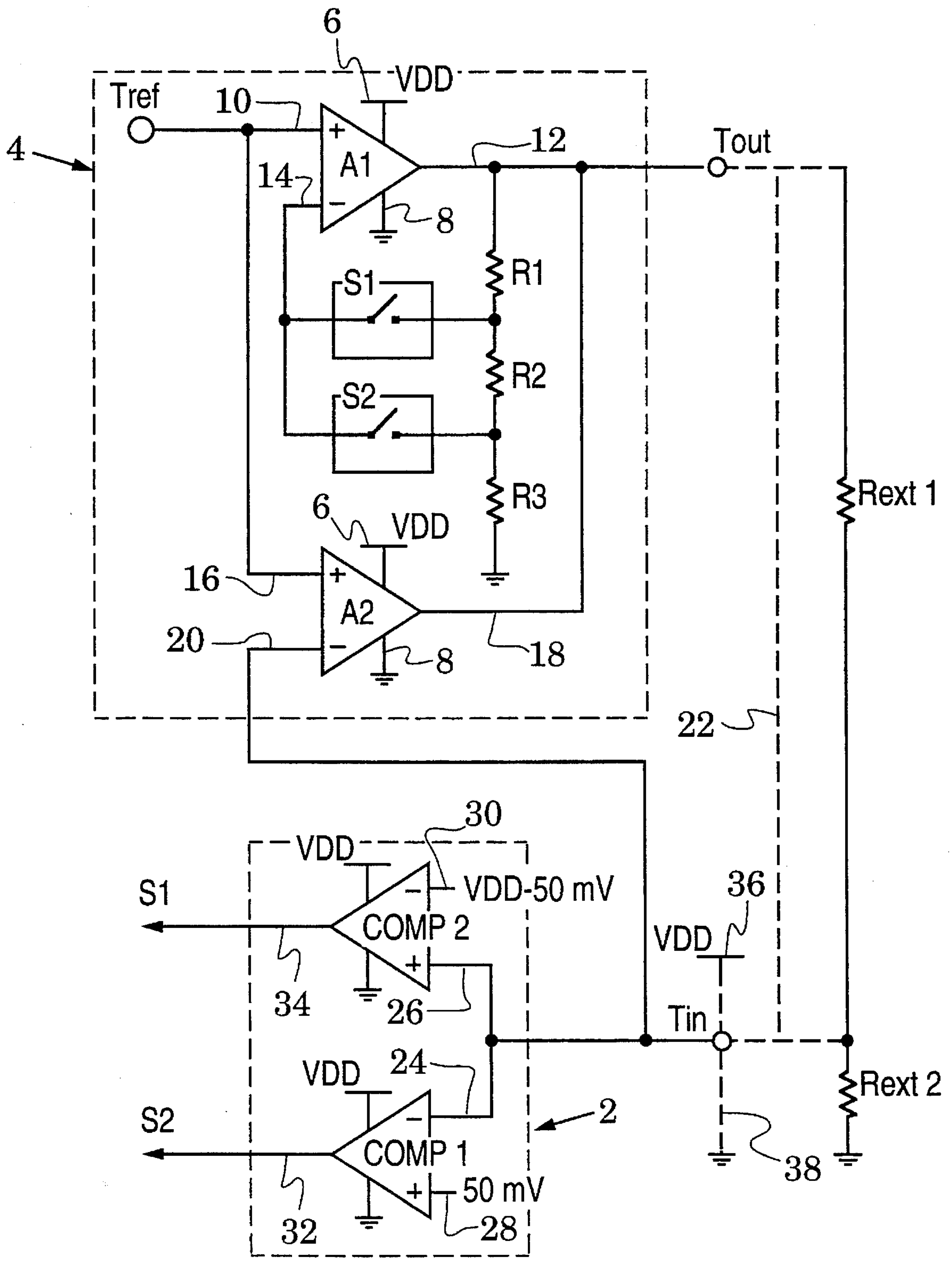
FIG. 1 is a schematic diagram showing a preferred circuit for implementing the new voltage regulator.

A preferred circuit for implementing the new voltage regulator is shown in FIG. 1. It includes an input terminal Tin to which an input control signal is applied to select a regulated voltage output, an output terminal Tout from which the regulated output voltage is taken, a window comparator circuit 2 that determines whether the control voltage at input terminal Tin is above, below or within a window voltage range, and an output circuit 4 that develops the desired regulated output in response to control inputs from the input terminal Tin and the window comparator 2.

The output circuit 4 includes a pair of operational amplifiers (op amps) A1 and A2, operated from high and low voltage supply lines 6 and 8 designated VDD and ground, respectively. The op amps can be implemented with conventional designs. VDD is typically 9 volts, while the low voltage supply is typically at ground potential but can be a negative voltage or a low level positive voltage, depending upon the particular amplifier design.

The first op amp A1 has its non-inverting input 10 connected to a reference voltage terminal Tref, which receives a reference voltage between the high and low voltage supply levels. The reference voltage level can be established in a conventional manner, such as by tapping the junction of a resistor and a zener diode that are connected in series between the high and low voltage supplies. A typical reference voltage level for a nine volt supply is 1.3 volts The output 12 of A1 is connected to the regulator's output terminal Tout, and also back to its inverting input 14 by a switched feedback circuit that is operated to select one of two possible fixed output voltages for the amplifier. Three resistors R1, R2 and R3 are connected in series between the amplifier output 12 and ground, with the junction of R1 and R2 connected back to the amplifier's inverting input through a first switch S1, and the junction between R2 and R3 connected back to the same inverting input through a second switch S2. As explained in further detail below, S1 and S2 are operated by the window comparator circuit 2. When S1 is closed and S2 open, the op amp A1 produces an output equal to the reference voltage multiplied by (R1+R2+R3)/(R2+R3), following the usual op amp gain function. When switch S2 is closed and S1 open, the output is equal to the reference voltage multiplied by (R1+R2+R3)/R3. With an appropriate selection of resistor ratios two different fixed regulated outputs can be provided, depending upon the selected feedback switching configuration. In the preferred embodiment the resistance values are selected to produce a regulated output of 3.3 volts when S1 is closed and S2 open, and 5 volts when the switching is reversed.

The other operational amplifier A2 also has its non-inverting input 16 connected to Tref and its output 18 connected to the regulated output terminal Tout, but its inverting input 20 is connected directly to the control input terminal Tin. When both of the feedback switches S1 and S2 for A1 are open, the output circuit enters a third mode in which the regulated output at Tout is established by A2. This occurs when an external circuit is connected across Tout and Tin to complete a feedback circuit for A2. Various options can be used for the external circuit, depending upon the desired regulated output in this third mode. Tout can be shorted to Tin, as indicted by dashed connector line 22. This sets the voltage level at both Tin and Tout at the reference voltage level of Tref through the normal operation of A2, which acts to equalize the voltages of its two inputs. Alternately, a user-supplied external voltage divider circuit consisting of a first resistor Rext1 connected between Tout and Tin, and a second external resistor Rext2 connected between Tin and ground, can be used. In this case A2 produces an output at Tout equal to the reference voltage multiplied by (Rext1+Rext2)/Rext2. The regulated supply output at Tout will thus be greater than the reference voltage level; the amount of gain is selected by the user by the ratio of the external resistor values. The window comparator 2 employs a pair of conventional voltage comparators COMP1 and COMP2. The input terminal Tin is connected to the negative input 24 of COMP1 and to the positive input 26 of COMP2. The positive input 28 of COMP1 is held at a convenient voltage offset, such as 50 mV, above the low voltage (ground) supply level, while the negative input 30 of COMP2 is held at a voltage offset (which may also be 50 mV) below the high voltage supply level. Series resistor and zener diode circuits can be used to establish the voltage offsets levels.

This interconnection of the two comparators produces the desired window comparator circuit, in which the window range extends from a lower limit at the lower voltage offset (50 mV in the preferred embodiment) to an upper voltage limit at the upper offset value (VDD-50 mV in the preferred embodiment). An input voltage at Tin higher than the window range will thus deactivate COMP1 but activate COMP2, since the negative input 24 of COMP1 will be at a higher voltage than its positive input 28, whereas the positive input 26 of COMP2 will be at a higher voltage than its negative input 30. Conversely, an input voltage below the window range will cause COMP1 to be activated and COMP2 to be deactivated, while an input voltage within the window range (between 50 mV and VDD-50 mV) will deactivate both comparators.

The outputs 32 and 34 of COMP1 and COMP2 are connected respectively to the switches S2 and S1 so that S1 is closed when COMP2 is activated, S2 is closed when COMP1 is activated, and both switches are open when neither comparator is activated. An input voltage greater than (VDD-50 mV) will thus cause op amp A1 to establish the output voltage at terminal Tout based upon the feedback circuit with S1 closed, an input voltage below 50 mV will cause A1 to establish the output voltage at Tout based upon the feedback circuit with S2 closed, and an input voltage within the window range of 50 mV to (VDD-50 mV) will open both switches S1 and S2 and allow op amp A2 to establish the output voltage, based upon a user-supplied circuit between Tout and Tin.

To allow the user to select among the three modes of operation, the input terminal Tin is shown as being connectable to the VDD supply line through connector 36, to ground through dashed connector 38, and to either the external resistor circuit Rext1/Rext2 or the short circuit 22 between Tout and Tin. Connecting Tin to VDD closes switch S1, connecting it to ground closes switch S2, and connecting it to one of the external circuits allows the regulated output voltage to be set by op amp A2.

Figure 2:
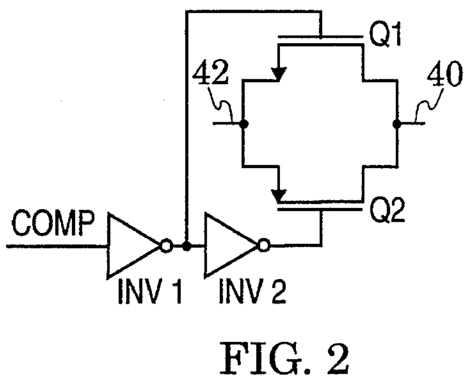
FIG. 2 is a schematic diagram of a preferred switch configuration for the regulator of FIG. 1.

FIG. 2 shows a suitable conventional switch design that can be used for either S1 or S2. It includes p-channel and n-channel field effect transistors Q1 and Q2 that are connected in parallel, with the opposed switch poles 40 and 42 taken from opposite sides of the parallel connection. A signal from the applicable comparator (COMP1 for S2 and COMP2 for S1) is processed through an inverter INV1 and delivered to the gate of Q1, and also to the gate of Q2 after a second inverter by inverting INV2. Since they receive mutually inverted inputs, the p-channel and n-channel devices are maintained in the same switching state. The provision of two complementary transistors produces a faster switching action than would a single transistor.

Figure 3:
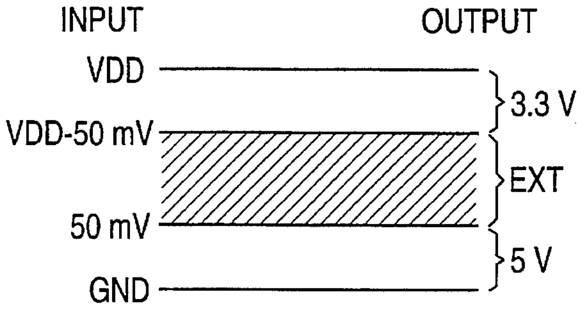
FIG. 3 is a chart relating the input control voltage to the regulated output voltage produced by the regulator circuit.

FIG. 3 is a chart illustrating an exemplary input-output voltage relationship that can be achieved with the invention. For input voltages between ground and 50 mV, switch S2 is closed and the relative resistance values of R1, R2 and R3 have been selected to produce an amplifier gain of approximately 3.9, resulting in a regulated output of 5 volts for a 1.3 volt internal reference. For inputs greater than (VDD-50 mV), S1 is closed and the ratio of resistor values results in a gain of approximately 2.5 to produce a 3.3 volt regulated output. Between 50 mV and (VDD-50 mV) both switches S1 and S2 are open, and the regulated output is set by the user. If the output terminal Tout is shorted to the input terminal Tin, the regulated output equals the internal reference of 1.3 volts; this output can be increased by connecting an external resistive feedback circuit for op amp A2.

Figure 4:
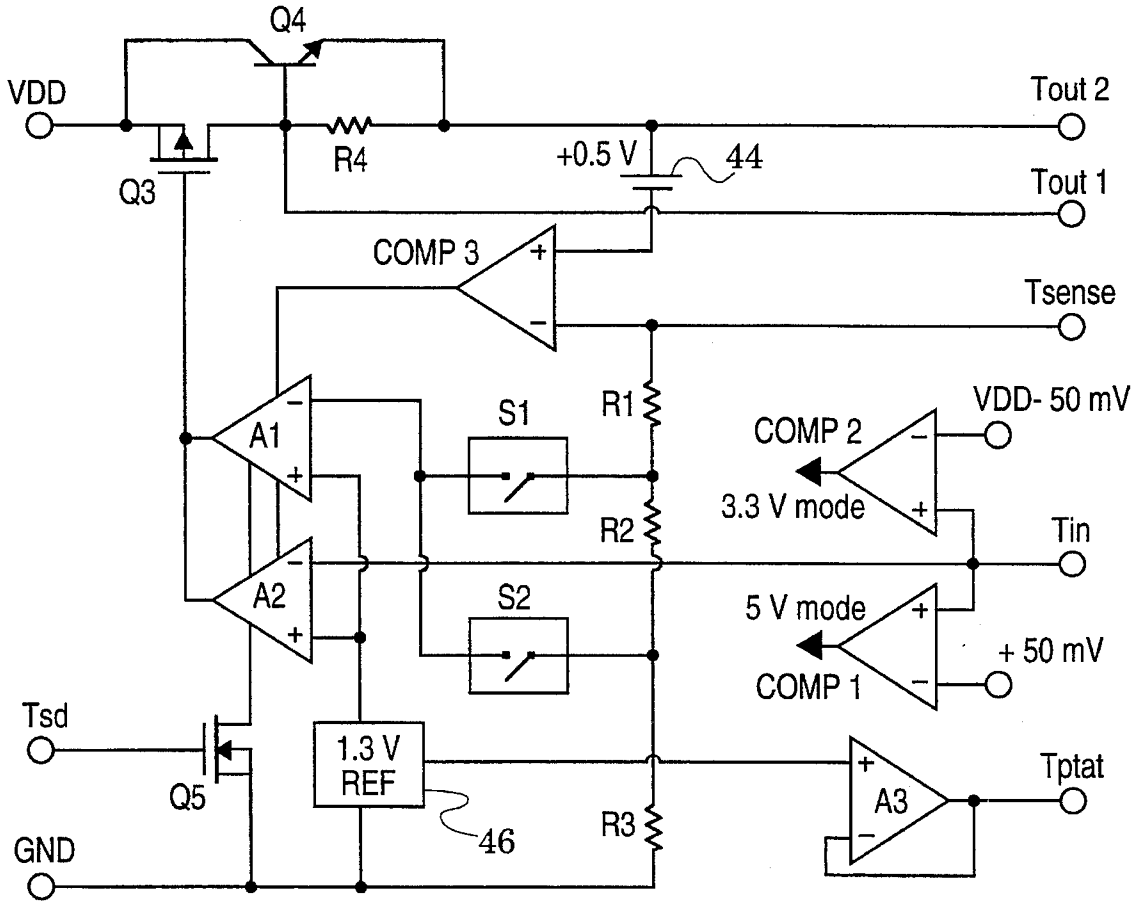
FIG. 4 is a schematic diagram of the overall chip architecture in which the regulator circuit is implemented.

A more complete chip layout for the regulator circuit is shown in FIG. 4. The output circuit includes a PMOS transistor Q3 that has a gate connected to receive the outputs of op amps A1 and A2, a source connected to VDD and the collector of an npn bipolar transistor Q4, and a drain connected to the base of Q4. A resistor R4 is connected between the base and emitter of Q4, with output terminals Tout1 and Tout2 connected respectively to the base and emitter sides of R4. Q3 provides a base drive to Q4, which operates for all three output modes. For low current outputs, output terminals Tout1 and Tout2 are preferably connected together to short out Q4, allowing Q3 to set the output by itself. This is advantageous because Q3 exhibits a low voltage drop for low output currents, allowing its output to closely track its input. For output currents greater than about 10 mA, on the other hand, the resistance of Q3 become significant and can produce an excessive voltage drop. In this situation the short is removed from Tout1 and Tout2, allowing Q4 to establish the regulated outlet at Tout2.

To provide an output current limit, a third comparator COMP3 receives a positive input from Tout2 through a 0.5 volt threshold offset 44, and a negative input from a sense terminal Tsense. The output of COMP3 is connected to provide the voltage supply for op amps A1 and A2. When an external resistor (not shown) is connected between Tout2 and Tsense, the regulated output is taken from Tsense, where the voltage is constant regardless of the output current level. For example, with an external 10 ohm resistor across Tout2 and Tsense, output currents in excess of 50 mA will generate a voltage across the resistor in excess of the 0.5 volt threshold established for COMP3, causing COMP3 to turn off and thereby shut off op amps A1 and A2.

A 1.3 volt reference circuit 46 provides the non-inverting input to op amp A1 and the non-inverting input to op amp A2. This reference can also be used to supply a buffer op amp A3 that provides a proportional to absolute temperature (PTAT) voltage at terminal Tptat. The output of A3 at terminal TPTAT would normally be inverted (not shown) and used to drive a liquid crystal display. A3 could also be rewired as a comparator and used to provide a low battery indicator.

Another pin of the overall chip architecture is used for a shut down function. The shut down terminal Tsd is connected to the gate of an NMOS transistor Q5, the drain-source circuit of which is connected between ground and the supplies for A1 and A2. Tsd is normally held at ground potential, allowing the circuit to operate normally. When it is raised above the turn-on voltage of Q5, typically about 0.8 volts, A1 and A2 are shut down and the regulated output goes to zero.

The described voltage regulator is capable of producing multiple fixed outputs, plus a user-selected output, with only one pin needed to select between the different modes. While a particular embodiment of the invention has been shown and described, numerous variations and alternate embodiments will occur to those skilled in the art. For example, while two fixed regulated voltage levels are provided by the illustrated circuit, additional fixed output levels could be made available by providing additional comparators to COMP1 and COMP2, additional resistors in series with R1, R2 and R3 in the feedback circuit for op amp A1, and additional switches to S1 and S2 for the additional resistors. With such an expanded circuit, more than one comparator could be activated at particular input voltage levels. In that case more than one switch would be closed at the same time, in effect shorting out one or more of the series resistors and thereby altering the resistive feedback ratio for A1 to produce a unique gain and output level for that particular range of input signals. As another example, switches S1 and S2 are described as being closed only for input voltages outside the window range, with both switches open for an input voltage within the window. This could be rearranged so that one of the switches is closed for an input voltage only within the window, in which case the window could be reduced from the VDD-50 mV range described herein to allow for a wide range of user-selected outputs. Accordingly, it is intended that the invention be limited only in terms of the appended claims.

I claim:

1. A multiple fixed plus user-selectable output voltage regulator, comprising:

a voltage window comparator having a voltage range with upper and lower window limits, an input terminal connected to supply an input voltage to said window comparator, an output terminal, and an output circuit connected to receive control inputs from said input terminal and said window comparator, said output circuit having first and second output states in which it supplies first and second respective fixed output voltages to said output terminal, and a third output state that enables the voltage at said output terminal to be externally set, said output circuit responding to input voltages in ranges above, below and within said window voltage range by entering a different output state for each different input voltage range, wherein said output circuit comprises first and second amplifier circuits, said window comparator produces a control signal in response to the input voltage being within a first of said input voltage ranges to cause said first amplifier circuit to produce said first fixed output voltage at said output terminal, said window comparator produces a control signal in response to the input voltage being within a second of said input voltage ranges to cause said first amplifier circuit to produce said second fixed output voltage at said output terminal, and said input terminal is connected to control said second amplifier to enable the externally set output voltage in response to the input terminal voltage being within a third of said input voltage ranges.

2. The voltage regulator of claim 1, said first and second amplifier circuits comprising respective first and second operational amplifier circuits, said first operational amplifier circuit comprising an operational amplifier with a switchable feedback circuit connected between its output and its inverting input, and a reference voltage terminal connected to its non-inverting input.

3. The voltage regulator of claim 2, said switchable feedback circuit comprising three resistors connected in series from the first operational amplifier's output to a low voltage reference, a first switch connected between the first operational amplifier's inverting input and a junction between the first and second resistors, and a second switch connected between the first operational amplifier's inverting input and a junction between the second and third resistors, said control signals closing one of said switches and opening the other switch in response to an input terminal voltage within one of said first and second input voltage ranges, and opening said one switch and closing the other switch in response to an input terminal voltage within the other of said first and second input voltage ranges.

4. The voltage regulator of claim 1, said second amplifier circuit comprising an operational amplifier with one of its inputs connected to a reference voltage terminal, and its other input connected to said input terminal.

5. The voltage regulator of claim 4, wherein the non-inverting and inverting inputs of said operational amplifier are connected respectively to said reference voltage terminal and said input terminal, said input and output terminals being connectable to an external feedback circuit for said operational amplifier to set its output voltage level.

6. A multiple fixed plus user-selectable output voltage regulator, comprising:

high and low voltage supply lines, a voltage window comparator with a window voltage range having an upper window limit below the high voltage supply and a lower window limit above the low voltage supply, an input terminal, an output terminal, and an output circuit connected to receive control inputs from said input terminal and said window comparator, said output circuit responding to an input terminal voltage above said window range by establishing a first fixed output voltage at said output terminal, to an input terminal voltage below said window range by establishing a second fixed output voltage at said output terminal, and to an input terminal voltage within said window range by enabling the voltage at said output terminal to be externally set, wherein said output circuit comprises first and second amplifier circuits, said window comparator produces control signals in response to the input terminal voltage being above or below said window range to cause said first amplifier circuit to produce said first and second fixed output voltages at said output terminal, respectively, and said input terminal is connected to control said second amplifier to enable an externally set output voltage in response to the input terminal voltage being within said window range.

7. The voltage regulator of claim 6, said first and second amplifier circuits comprising respective first and second operational amplifier circuits, said first operational amplifier circuit comprising an operational amplifier with a switchable feedback circuit connected between its output and its inverting input, and a reference voltage terminal connected to its non-inverting input.

8. The voltage regulator of claim 7, said switchable feedback circuit comprising three resistors connected in series from the first operational amplifier's output to a low voltage reference, a first switch connected between the first operational amplifier's inverting input and a junction between the first and second resistors, and a second switch connected between the first operational amplifier's inverting input and a junction between the second and third resistors, said control signals closing one of said switches and opening the other switch in response to an input terminal voltage above said window range, and opening said one switch and closing the other switch in response to an input terminal voltage below said window range.

9. The voltage regulator of claim 6, said second amplifier circuit comprising an operational amplifier with one of its inputs connected to a reference voltage terminal, and its other input connected to said input terminal.

10. The voltage regulator of claim 9, wherein the non-inverting and inverting inputs of said operational amplifier are connected respectively to said reference voltage terminal and said input terminal, said input and output terminals being connectable to an external feedback circuit for said operational amplifier to set its output voltage level.

11. A multiple fixed plus user-selectable output voltage regulator, comprising:

first and second operational amplifiers having respective inverting and non-inverting inputs and respective outputs, first and second comparators having respective first and second inputs and respective outputs connected to a common output terminal, a switchable feedback circuit connected between the output and the inverting input of said first operational amplifier, a reference voltage terminal connected to the non-inverting inputs of both operational amplifiers, an input terminal connected to the first inputs of said first and second comparators, and high and low comparator voltage references connected to the second inputs of said first and second comparators, respectively, said comparator outputs being connected to control the switching of said switchable feedback circuit to establish a first fixed voltage at said output terminal when the input terminal voltage exceeds said high comparator voltage reference, and a second fixed voltage at said output terminal when the input terminal voltage is less than said low comparator voltage reference, said second operational amplifier establishing the output terminal voltage when the input terminal voltage is between said high and low comparator voltage reference.

12. The voltage regulator of claim 11, further comprising respective high and low voltage supply lines for said operational amplifiers and said comparators, wherein said high comparator voltage reference is less than the high voltage supply and said low comparator voltage reference is higher than the low voltage supply.

13. The voltage regulator of claim 12, wherein said high and low comparator voltage references are substantially equal voltage increments respectively below said high voltage supply and above said low voltage supply.

14. The voltage regulator of claim 11, said switchable feedback circuit comprising three resistors connected in series from the first operational amplifier's output to a low voltage reference, a first switch connected between the first operational amplifier's inverting input and a junction between the first and second resistors, and a second switch connected between the first operational amplifier's inverting input and a junction between the second and third resistors, said comparator outputs closing one of said switches and opening the other switch in response to said input terminal voltage exceeding said high comparator voltage reference, and opening said one switch and closing the other switch in response to said input terminal voltage being less than said low comparator voltage reference.

15. The voltage regulator of claim 11, wherein said input terminal is connected to the inverting input of said second operational amplifier.

16. The voltage regulator of claim 15, wherein said input and output terminals are connectable to an external feedback circuit for said second operational amplifier to establish the output terminal voltage when the input terminal voltage is between said high and low comparator voltage references.

* * * * *